United States Patent [19]

Dobkin et al.

[11] Patent Number: 4,575,685

[45] Date of Patent: Mar. 11, 1986

[54] ARRANGEMENT FOR CANCELLING THE INPUT BIAS CURRENT, AT PICOAMPERE LEVELS, IN AN INTEGRATED CIRCUIT

[75] Inventors: Robert C. Dobkin, San Jose; George Erdi, Portola Valley; Carl T. Nelson, San Jose, all of Calif.

[73] Assignee: Linear Technology Corporation, Milpitas, Calif.

[21] Appl. No.: 637,389

[22] Filed: Aug. 3, 1984

[51] Int. Cl.$^4$ .......................................... H03F 3/45
[52] U.S. Cl. ................................. 330/261; 330/257; 330/296
[58] Field of Search ............ 330/256, 257, 261, 288, 330/289, 296, 258, 259

[56] References Cited

U.S. PATENT DOCUMENTS 4,068,254  1/1978  Erdi ................................ 330/261 X

FOREIGN PATENT DOCUMENTS 0001306  1/1983  Japan ................................ 330/261

Primary Examiner—Eugene R. LaRoche
Assistant Examiner—Steven J. Mattola
Attorney, Agent, or Firm—Flehr, Hohbach, Test, Albritton & Herbert

[57] ABSTRACT

An arrangement for cancelling the input bias current, at picoampere levels, in linear integrated circuits such as operational amplifiers, comparators, and the like is disclosed herein. This arrangement utilizes circuitry including a tracking transistor which is virtually independent of the presence or absence of leakage current in the overall integrated circuit, even at relatively high temperatures, for example 125° C., where leakage current can be most significant.

23 Claims, 2 Drawing Figures

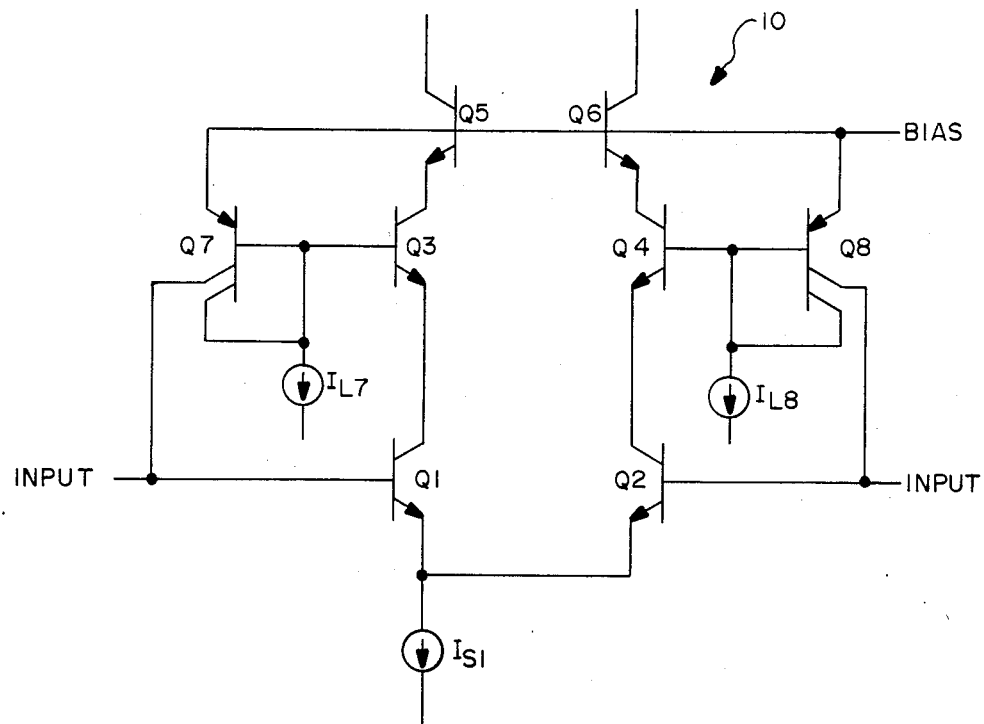
FIG.—1
PRIOR ART

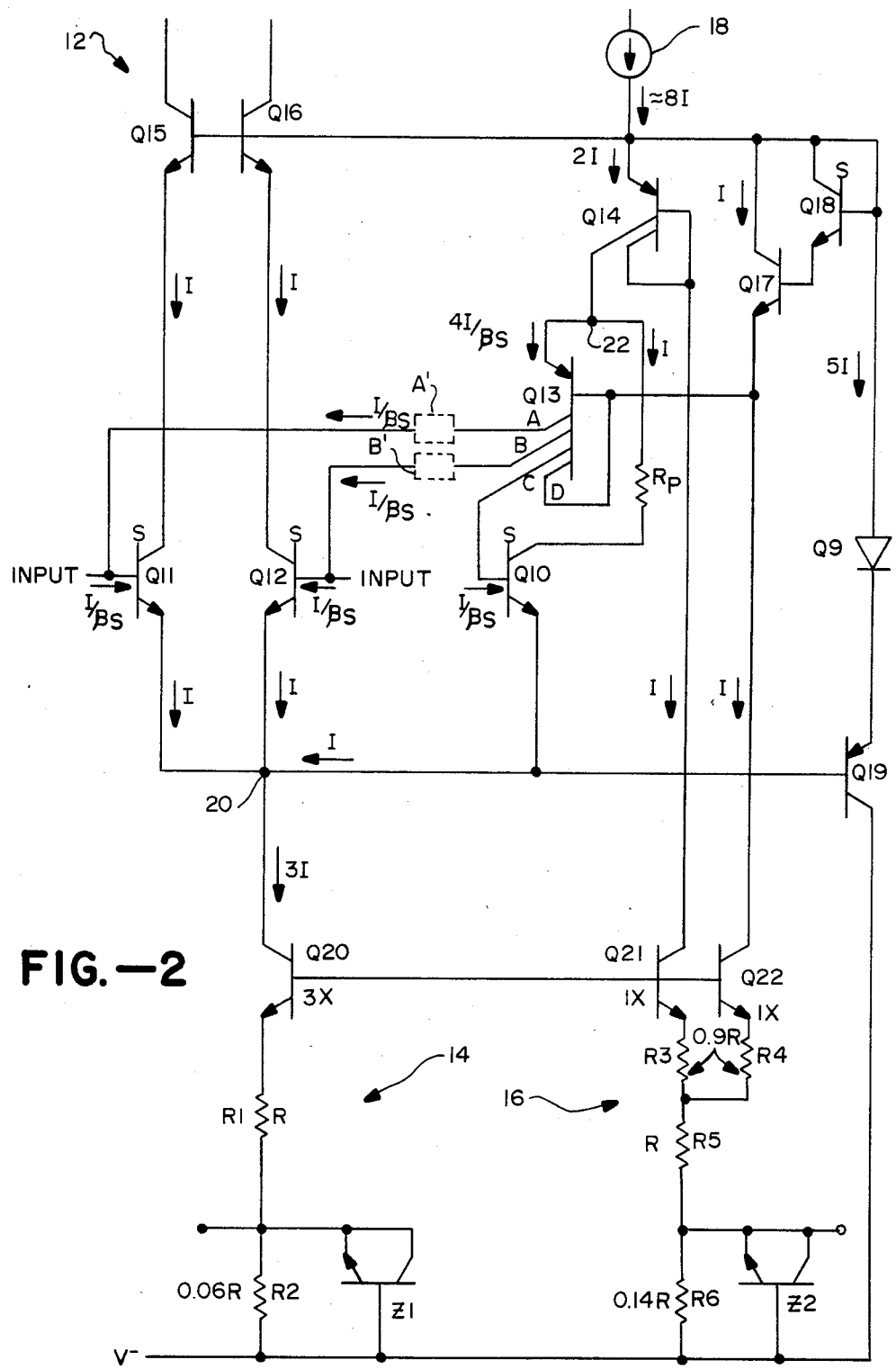
FIG.—2

ARRANGEMENT FOR CANCELLING THE INPUT BIAS CURRENT, AT PICOAMPERE LEVELS, IN AN INTEGRATED CIRCUIT

The present invention relates generally to integrated circuits such as operational amplifiers, comparators, sample and holds, instrumentation amplifiers, and the like, and more particularly to an arrangement capable of cancelling the bias current, at picoampere levels, in such circuits.

Input bias current cancellation is a commonly used method for reducing the bias current of linear integrated circuits such as the ones recited above. The bias current cancellation arrangement representative of the prior art is illustrated in FIG. 1. As will be discussed immediately below, this arrangement which is generally indicated by the reference numeral 10 is used to cancel the base (bias) currents of input transistors Q1 and Q2 forming part of an overall linear integrated circuit which is shown (only partially) to include the two input transistors, biasing transistors Q5 and Q6 and current source $I_{S1}$. Other components of the overall integrated circuit have not been shown but may be readily provided and, in any event, do not form part of the present invention.

Still referring to FIG. 1, arrangement 10 is shown including NPN transistors Q3, Q4 and lateral PNP transistors Q7, Q8. Transistors Q3 and Q4 are connected in circuit with input transistors Q1 and Q2, respectively, such that the base current of Q3 tracks the base current of Q1 and such that the base current of Q4 tracks the base current of Q2. At the same time, the lateral PNP transistors Q7 and Q8 are connected in circuit with the tracking transistors Q3 and Q4, respectively, such that the base current of tracking transistor Q3 is current-mirrored by transistor Q7 and such that the base current of tracking transistor Q4 is current-mirrored by transistor Q8. As illustrated in FIG. 1, the mirrored current at the output (collector) of transistor Q7 is injected into the base of input transistor Q1 while, at the same time, the mirrored current at the output (collector) of transistor Q8 is injected into the base of input transistor Q2, effectively cancelling the input base (bias) currents of these transistors.

The cancellation scheme just described presupposes that the mirrored current at the output of each lateral PNP transistor Q7, Q8 is, at all times, identical to the base current of its associated tracking transistor Q3, Q4 which, in turn, is intended to be identical to the base current of its associated input transistor Q1, Q2. Under these ideal circumstances the mirrored current would be identical to the base current of its associated input transistor so that cancellation of the base current is possible. However, in reality, there is current leakage from the base of each of the lateral PNP transistors Q7 and Q8 (the epi-to-isolation leakage represented by current sources $I_{L7}$ and $I_{L8}$). Moreover, this leakage can reach tens of nanoamperes at elevated temperatures of, for example, 125° C. As a result, the collector current of each of the transistors Q7 and Q8 does not accurately track the base current of its associated tracking transistor Q3 and Q4 and, hence, it does not accurately cancel the bias current at the base of its associated input transistor. Nevertheless, for integrated circuits operating at base currents of nanoamperes, the amount of leakage which takes place at transistors Q7 and Q8 can be effectively ignored and the overall cancellation arrangement 10 can be effectively used in such circuits.

While nanoampere leakage can be ignored in integrated circuits with base currents at nanoampere levels, it cannot be ignored in integrated circuits with base currents at picoampere levels and therefore arrangement 10 is not satisfactory for use in such circuits. Bias current cancellation schemes which suffer the same deficiency are disclosed in U.S. Pat. No. 4,068,254 and an article entitled INSTRUMENTATION OPERATIONAL AMPLIFIER WITH LOW NOISE, DRIFT, BIAS CURRENT by George Erdi and published in the NEREM, 1972 Conference Digest. The circuit arrangement disclosed in each of these latter schemes may be satisfactory for cancelling bias current at nanoampere levels but have not been found to be satisfactory for use in integrated circuits with picoampere bias currents.

Still other prior art bias current cancellation schemes do not take into account fluctuations in common mode input voltages. As a result, if the common mode input voltage does fluctuate, corresponding errors are introduced into the cancellation circuitry.

In view of the foregoing, it is one object of the present invention to provide an input bias current cancellation arrangement which is especially suitable for use in integrated circuits such as operational amplifiers, comparators, and the like, having a common mode input voltage and input bias currents at picoampere levels, even if the components making up the integrated circuit are subjected to relatively high temperatures, for example 125° C.

Another object of the present invention is to provide an arrangement of the last-mentioned type which functions reliably regardless of fluctuations in its common mode input voltage.

A more particular object of the present invention is to provide an input bias current cancellation arrangement which functions in the intended way substantially independent of leakage current, thereby making it possible to function effectively in integrated circuits with picoampere bias currents.

Another specific object of the present invention is to provide a picoampere level current cancellation arrangement which does not adversely affect the AC operation of the overall integrated circuit by severely slowing down slewing of the circuit.

Still another particular object of the present invention is to provide an arrangement of the last-mentioned type which is capable of adjusting input bias current at wafer testing.

As will be described in more detail hereinafter, the arrangement disclosed herein is especially suitable for cancelling picoampere bias currents at the base of the two input transistors forming part of the overall integrated circuit. The arrangement includes a tracking transistor having the same gain characteristics as that of the input transistors. The arrangement also includes first circuit means acting on both the tracking and input transistors so as to cause the same amount of current to flow in the collectors of each of the transistors regardless of fluctuations in the common mode input voltage of the integrated circuit, whereby to limit the tracking transistor to the same amount of base current as the bias current at the base of the input transistors. At the same time, the arrangement provides second circuit means, preferably a multi-collector lateral transistor, connected to the base of each of the tracking and input transistors for supplying the tracking transistor with its base current and, simultaneously, injecting identical currents into the bases of the input transistors in order to cancel the bias current at the input transistors' bases. This second circuit means is configured such that the current injected into the bases of the input transistors is equal to the base current of the tracking transistor independent of the presence or absence of leakage current in the integrated circuit.

In a preferred embodiment of the present invention, the first circuit means forming part of the arrangement just described is designed to cause the tracking transistor to saturate and thereby rapidly discharge the capacitance present at its base during slewing in the negative direction of the overall integrated circuit, whereby to allow negative slewing to take place rapidly. This, in turn, allows the overall integrated circuit to maintain satisfactory AC performance. In this same preferred embodiment, the arrangement includes third circuit means for maintaining the base to collector voltages of the input and tracking transistors within a fixed voltage range, preferably between about 100 mv and 200 mv, while at the same time causing the base to collector voltage of the tracking transistor to track the base to collector voltage of the input transistor, whereby to further reduce the effects of leakage current on the arrangement. Still another feature of this preferred arrangement resides in the utilization of a network of resistors and zener diodes which are configured such that the zener diodes can be shorted out at wafer testing to selectively change the resistor network for adjusting the bias current at the base of the tracking transistor in order to more accurately cancel the base currents of the input transistors.

The bias current cancellation arrangement disclosed will be described in more detail hereinafter in conjunction with the drawings wherein:

FIG. 1 schematically illustrates a bias current cancellation scheme representative of the prior art; and FIG. 2 schematically illustrates a picoampere bias current cancellation arrangement designed in accordance with a preferred embodiment of the present invention.

Having previously discussed the prior art scheme illustrated in FIG. 1, attention is immediately directed to FIG. 2 which, as stated above, illustrates a picoampere level bias current cancellation arrangement designed in accordance with the present invention. This arrangement, which is generally indicated by the reference numeral 12 comprises part of an overall integrated circuit having a common mode input voltage (the voltage between the base of each input transistor Q11 and Q12 and V−). Arrangement 12 is specifically designed to cancel the bias current at the base of each of two super gain NPN input transistors Q11 and Q12 forming part of an overall integrated circuit which is only partially shown. Arrangement 12 includes a tracking transistor Q10 having the same gain characteristics as these input transistors, specifically the current gain $\beta_s$. Arrangement 12 also includes additional circuitry for causing a fixed current I to flow in the collectors of each of these transistors Q10, Q11 and Q12. As a result, the base current of tracking transistor Q10 and the base current of each input transistor will always be the same, that is, $I/\beta_s$. Also, as seen in FIG. 2, the emitter of tracking transistor Q10 is connected to the common mode voltage and therefore floats with it. Thus, the currents (I) flowing into the collectors of the three transistors will float together and therefore remain equal to one another.

The circuit components utilized to accomplish the above include current regulating networks 14 and 16, a multi-collector lateral PNP transistor Q14 which functions as a current mirror, a feedback loop consisting of multi-collector lateral PNP transistor Q13 and tracking transistor Q10, and a sufficiently large supply of current which is diagrammatically illustrated at 18. In an actual working embodiment, supply 18 provides eight times the current I, although only slightly more than three times the current I is necessary as will be seen. Current regulator 14 includes NPN transistor Q20, and the network of resistors R1, R2. Current regulator 16 is comprised of NPN transistors Q21, Q22, the network of resistors R3–R6.

Having described current regulators 14 and 16 and its associated circuitry, attention is now directed to the way in which this circuitry functions to cause the fixed current I to flow between the collectors and emitters of transistors Q10, Q11 and Q12. First, it should be noted that in order to establish the current I across each of the transistors Q11 and Q12, the same current level must be established across the transistor Q10. In order to accomplish this, current regulator 16 is designed to draw fixed current I from the base of multi-collector transistor Q14. Because this latter transistor functions as current mirror, the same amount of current, that is, current I will flow from its collector, as illustrated in FIG. 2. Thus, the current 2I must flow into its emitter from the supply 18. All of the current I flowing out of the collector of transistor Q14, except for a negligible amount $(4I/\beta_s)$ will flow through the resistor $R_p$ and across transistor Q10 from its collector to its emitter, as required. The reason for the loss of negligible current $(4I/\beta_s)$ will be pointed out hereinafter. For purposes of operation of arrangement 12, this negligible loss can be ignored and it can be assumed that the current I is, indeed, flowing across the transistor Q10 from its collector to its emitter.

All of the current I flowing across transistor Q10 (except for a negligible amount at the base of transistor Q19) flows into the junction 20 connecting the emitters of transistors Q10, Q11 and Q12 and the collector of transistor Q20. Note that this latter transistor has three times the emitter area of transistors Q21 and Q22. Transistor Q20 in combination with the resistors R1, R2 draws 3I current from junction 20. Since the transistor Q10 is contributing 1I current at this junction, 2I current must be contributed by transistors Q11 and Q12, as diagrammatically illustrated in FIG. 2. In this regard, it should also be noted that the overall integrated circuit of which arrangement 12 is only a part includes standard circuitry necessary to cause equal currents to flow across the collectors and emitters of its input transistors Q11 and Q12. Therefore, the current I must flow across each of these latter transistors. That being the case, since the gain of each of these transistors Q11 and Q12 is $\beta_s$, the bias current at the base of each must be $I/\beta_s$. At the same time, since the identical transistor Q10 has the same current I flowing from its collector to its emitter, its base current must also be equal to $I/\beta_s$.

As will be seen below, the base current $I/\beta_s$ of the tracking transistor Q10 is used to produce identical currents $I/\beta_s$ which are injected into the bases of input transistors Q11 and Q12, virtually independent of leakage current, in order to effectively cancel the bias current $I/\beta_s$ at the base of each of the input transistors, even if these latter transistors are operating at picoampere levels. This is accomplished utilizing multi-collector lateral PNP transistor Q13 which is electrically connected in overall arrangement 12 in the manner shown and which includes three functioning collectors A, B and C and a fourth collector D provided merely for ease in manufacturing the transistor (by making it symmetric). This latter collector is connected back to its base and, therefore, may be ignored. All four of these collectors are identical in size.

Transistor Q13 operates in arrangement 12 in the following manner. As illustrated in FIG. 2, its emitter is connected to junction 22 which, in turn, is connected to the collector of current mirror transistor Q14 and to the collector of transistor Q10 through the resistor $R_p$. As stated previously, because current regulator 16 draws the current I from the base of transistor Q14, its collector has the same current I. When this current initially appears at junction 22, the entire amount will flow into the emitter of transistor Q13, thereby driving the base of transistor Q10 with a large amount of current. As a result, the collector of transistor Q10 will strive to draw $\beta_s$ times that current from junction 22, an amount greater than the current I available at the junction. Because of this feedback action, all of the current at junction 22 (the current I), except for a small amount $(4I/\beta_s)$ will be drawn from junction 22 across transistor Q10 from its collector to its emitter and the amount $4I/\beta_s$ can be ignored since it is so small.

Thus, the amount of current which must be drawn into the base of transistor Q10 from the collector C of transistor Q13 is $I/\beta_s$. Since equal amounts must flow from the other identical collectors of transistor Q13 (due to its design), the current $I/\beta_s$ also flows from collectors A, B and D, thereby accounting for the total $4I/\beta_s$ entering the emitter of that transistor. As illustrated in FIG. 2, each of the collectors A and B is connected into the base of each of the input transistors Q11 and Q12, respectively, thereby injecting the current $I/\beta_s$ into each base. Since, as stated previously, the bias current at each base is $I/\beta_s$, the injected current is precisely enough to cancel this bias current. Note, that this is independent of any leakage current at transistor Q13. The epi-to-isolation leakage current (which dominates the prior art circuit of FIG. 1) of Q13 is provided by transistor Q17 and does not affect the currents in the collectors A, B and C of Q13. Nevertheless, smaller, second order leakage currents might be present, especially at elevated temperatures, such as 125° C., between the collector and base of each of the transistors Q10, Q11 and Q12. However, as will be seen hereinafter, this is compensated for by operating these transistors at base to collector voltages within a fixed range, specifically between 100 mv and 200 mv, while at the same time making sure that the base to collector voltage of transistor Q10 always tracks the base to collector voltages of transistors Q11 and Q12.

From the foregoing, it should be apparent that a primary feature of the present invention is the ability to cancel the bias current at the base of each of the input transistors Q11, Q12 virtually independent of leakage current, thereby allowing arrangement 12 to be used reliably in integrated circuits which operate at picoampere levels. A second feature of the present invention is that transistor Q10 saturates while the inputs are slewing in the negative direction in arrangement 12. The necessity for Q10 saturating is demonstrated by examining a typical implementation of arrangement 12. The collector current of transistor Q10 is 4 microamps and therefore its base current would range from 0.5 to 2 nanoamps for super current gains ($\beta_s$) of 2,000 to 8,000. This means that at the base of transistor Q10 only 0.5 to 2 nanoamps is available to discharge the Q10 base node. The capacitance at this node is approximately 0.02 pF, the capacitance to the negative supply of the metal lead connecting the C collector of transistor Q13 to the base of transistor Q10, as it crosses the isolation area between the two components. During slewing in the negative direction, this seemingly negligible capacitance would limit the slewing of the base of Q10 to 0.1 v/microseconds (equal to 2 nanoamps/0.02 pF). As the inputs are driven at a rate faster than 0.1 v/μsec, Q10 wants to gather most of the 3I current provided by Q20 trying to increase the Q10 base current. Therefore the currents left for Q11 and Q12 would be significantly less than I, causing serious distortions in AC response. However, current mirror Q14 limits the collector current of Q10 to the fixed amount I during negative slewing, as this current tries to increase it cannot and the transistor will saturate with a resultant large increase in its base current which can discharge the 0.02 pF capacitor at a fast rate. Thus, distortions in AC response due to the presence of arrangement 12 in the overall integrated circuit are minimized, if not eliminated entirely.

Overall current cancellation arrangement as described thus far provides a first order solution for eliminating the adverse effects of the presence of leakage current, as described previously. However, a second order problem resides in the presence of collector-base leakage contributions of transistors Q11 and Q12, especially if these transistors operate at elevated temperatures, for example 125° C. The collector to base leakage contributions of transistors Q11 and Q12 are minimized by maintaining the collector-base voltage of each between 100 mv and 200 mv, as described by R. J. Widlar in "DC Error Reduction in Bipolar Opamps", 1980 IEEE International Solid State Circuits Conference Digest of Technical Papers, pp. 204–205. Another feature of the present invention is to cause the collector to base voltage of transistor Q10 to track these same voltages of transistors Q11 and Q12 over temperature. In this way, leakage current is not only minimized (due to the operating voltages of the transistors) but, in addition, should leakage currents be present, they do not affect the cancellation scheme since they are equal in all three transistors, regardless of temperature.

The collector to base voltage ($V_{CB}$) of each of the transistors Q11 and Q12 is established as shown in FIG. 2 by the following formula:

$$V_{CBQ11} = V_{BEQ19} + V_{BEQ9} - V_{BEQ15} - V_{BEQ11} \tag{1}$$

where $V_{BE}$ = base emitter voltage
Since Q19 and Q9 are operating the 5I versus I for Q11 and Q15, and Q11 is a super gain transistor and thus its $V_{BE}$ is lower, $V_{CB}$ will be between 100 mv and 200 mv.

The collector to base voltage of Q10 is given by (from FIG. 2):

$$V_{CBQ10} = V_{BEQ19} + V_{BEQ9} - V_{BEQ18} - V_{BEQ17} + V_{BEQ13} - V_{BEQ10} - IR_p \tag{2}$$

$V_{BEQ17}$ will equal $V_{BEQ15}$ since both Q15 and Q17 are NPN transistors operating at current I. Also, from previous discussion, $V_{BEQ11} = V_{BEQ10}$. Therefore, comparing equations (1) and (2):

$$V_{CBQ10} = V_{CBQ11} \text{ if } V_{BEQ13} = V_{BEQ18} + IR_p \qquad (3)$$

The collector to base voltage of Q10 will track the collector to base voltage of Q11 and Q12 if equation (3) is maintained over temperature. At first glance, equation (3) equates a lateral PNP transistor (Q13) $V_{BE}$ with a super gain transistor $V_{BE}$ and a voltage across a pinch resistor, and therefore will not track well with temperature. However, Q13 operates at $4I/\beta_s$. If $\beta_s$ is high $V_{BEQ13}$ is low. Similarly since, Q18 is a super gain transistor; if $\beta_s$ is high $V_{BEQ18}$ will be low. The operating current of Q18 is $I/\beta$. If $\beta$ is high, $V_{BEQ18}$ will be low. However, the value of pinch resistor $R_p$ will be proportional to $\beta$ and will compensate for the decreased $V_{BEQ18}$. Thus, the equality of equation (3) is maintained at least to a first order approximation.

Still another feature of the present invention resides in the network of resistors R1–R6 and zener diodes Z1 and Z2 forming part of current regulators 14 and 16. Specifically, these components can be used to make adjustments to the input bias current at wafer testing. Zener diodes Z1 or Z2 or both can be selectively shorted (permanently) to reduce input current. When the input current is undercancelled, i.e., when the current is flowing into the device, zener diode Z2 or Z2 and Z1 can be shorted and a six fold improvement is possible using the comparative values shown for the various resistors R1–R6. Conversely, for overcancelled circuits, Z1 can be shorted for a three times improvement. In other words, should the rest of the circuitry making up arrangement 12 not completely cancel the bias current or overcancel it, the zener diodes Z1 and Z2 can be selectively shorted out to further reduce the uncancelled current or components for overcancellation. As a specific example, if R is equal to 4.0 Kohms, I is equal to 4 microamps and $\beta_s$ is equal to 2,000, input bias currents of $-150$ picoamps to $+300$ picoamps can be reduced to $+/-50$ picoamps. The range of adjustment tracks the current gain and, thus, if $\beta_s$ is doubled to 4,000 all the above numbers are halved. This is a useful feature because adjustment is most likely needed when $\beta_s$ is low; conversely, when $\beta_s$ is high more fine tuning is possible.

As described above, equal currents I are forced into the collectors of tracking transistor Q10 and input transistors Q11 and Q12 by means of the current regulators 14 and 16. While this is a preferred approach, the current forced into the collectors of the input transistors do not have to be made equal to the current forced into the tracking transistor but merely proportionate at all times. In other words, the bias current cancellation arrangement described above could be designed in accordance with the present invention such that the currents injected into the collectors of the input transistors are, for example, 0.5I, 2I or some other given, fixed proportion of the current injected into the collector of tracking transistor Q10. Current regulators 14 and 16 could be readily modified to this extent. For example, the current regulator 16 could be designed to pull I current while the regulator 14 could be designed to pull 2I current. Under these circumstances, 0.5I current would be forced into the collector to each of the input transistors Q11 and Q12. On the other hand, the current regulator 14 could be designed to pull 5I, in which case 2I current would be injected into the collector of each of the input transistors.

In the event arrangement 12 is modified to operate at proportionate but not equal currents in the manner just recited, it would be necessary to modify the circuitry associated with multi collector lateral transistor Q13. Specifically, as described previously, when the currents forced into the collectors of the tracking and input transistors are equal, their base currents are equal. On the other hand, when these currents are proportionate to one another but not equal, the base currents are of the same proportion but not equal. As a result, in order to cancel the bias current at the base of each of the input transistors, the currents flowing out of the collectors A and B of transistor Q13 must be altered so as to be of the same proportion as the current flowing out of the collector C but not equal as is the case in the embodiment in FIG. 2. To this end, means generally indicated by dotted lines at A' and B' in FIG. 2 may be utilized to make these alterations. Thus, for example, if the currents flowing into the collectors of transistors Q11 and Q12 are equal to one half the current flowing into the collector of transistor Q10, the currents flowing out of the collectors A and B of transistor Q13 must be halved. Means A' and B' could be readily designed to provide this alteration. In this regard, it should be noted that because the emitter of transistor Q10 floats with the common mode input voltage, the various current proportions just discussed and discussed immediately above would be fixed regardless of fluctuations in the common mode input voltage. In other words, even if the common mode input voltage fluctuates, the currents into the collectors of input transistors Q11 and Q12 would retain the same given proportion to the current flowing into the collector of tracking transistor Q10.

What is claimed:

1. In an integrated circuit such as an operational amplifier, a comparator, or the like having a common mode input voltage, an arrangement for cancelling the input bias current at the base of an NPN input transistor forming part of the integrated circuit, said arrangement comprising:

(a) an NPN tracking transistor having the same characteristics as said input transistor;

(b) first circuit means acting on both said tracking and input transistors so as to cause currents to flow in the collectors of said transistors in a given, fixed proportion to one another regardless of fluctuations in said common mode input voltage, whereby to limit the tracking transistor to a base current in the same given proportion to the bias current at the base of said input transistor; and (c) second circuit means in circuit with said tracking and input transistor for supplying the tracking transistor with its base current and, at the same time, providing along with said last-mentioned base current a second current in said given proportion and applying said second proportionate current to the base of said input transistor in order to cancel the bias current at the input transistor's base, said second circuit means including PNP transistor means connected in a feedback loop with said tracking transistor with only a collector means of said PNP transistor means being connected to the base of said tracking transistor for supplying said last-mentioned transistor with its base current and with a second collector means of said PNP transistor means being connected to the base of said input transistor for supplying said second current, whereby said second current and the base current of the tracking transistor remain fixed in said given proportion independent of the presence or absence of leakage current in the integrated circuit.

2. An arrangement according to claim 1 wherein said PNP transistor means includes a first collector connected directly and only to the base of said tracking transistor and a second collector connected directly to the base of said input transistor.

3. An arrangement according to claim 2 wherein said given proportion is such that said proportionate currents are equal to one another and wherein said PNP transistor means is a multi-collector lateral PNP transistor including said two collectors.

4. An arrangement according to claim 3 wherein said integrated circuit includes a second input transistor, wherein said first circuit means acts on both of said input transistors as well as said tracking transistor so as to cause the same amount of current to flow in the collector of each of said input and tracking transistors, and wherein said multi-collector lateral transistor includes a third collector connected directly to the base of the second input transistor, whereby to cancel the bias current at the base of the second input transistor.

5. An arrangement according to claim 4 wherein said first circuit means include a first current source and transistor means functioning as a current mirror acting together on said tracking transistor for causing a fixed amount of current to flow into its collector and a second current source acting on said input transistors for causing said fixed amount of current to flow in the collector of each input transistor.

6. An arrangement according to claim 5 wherein the emitters of said tracking and input transistors are connected together to form a common junction and wherein said second current source is connected to said junction, said second current source causing three times said fixed amount of current to flow from said junction, whereby two times said fixed amount of current flows from the emitters of said input transistors, said integrated circuit including means for causing an equal amount of current to flow in the collectors of said input transistors, whereby said fixed amount flows across the collector and emitter of each.

7. An arrangement according to claim 1 wherein said first circuit means includes means for causing the tracking transistor to saturate so as to cause the tracking transistor to rapidly discharge any capacitance present at its base during slewing in the negative direction of the overall integrated circuit whereby to allow slewing in the negative direction to take place rapidly.

8. An arrangement according to claim 3 including third circuit means for causing the base to collector voltages of said input and tracking transistors to be within a fixed voltage range.

9. An arrangement according to claim 8 wherein said third circuit means includes means for causing the base to collector voltage of said tracking transistor to always equal and track over temperature the base to collector voltage of said input transistors within said range.

10. An arrangement according to claim 9 wherein said voltage range is between about 100 mv and 200 mv.

11. An arrangement according to claim 1 wherein first circuit means includes means for adjusting slightly the amount of current which flows in the collector of said tracking transistor is compared to the current flowing in the collector of said input transistors while keeping the amounts substantially in said given proportion whereby to compensate for over or under cancellation of the bias current at the base of said input transistors.

12. An arrangement according to claim 11 wherein said adjusting means includes a network of resistors and a network of zener diodes which can be selectively shorted out to provide said adjustment.

13. In an integrated circuit such as an operational amplifier, a comparator, or the like having a common mode input voltage, an arrangement for cancelling the input bias current at the base of each of two identical NPN input transistors forming part of the integrated circuit, said arrangement comprising:
   (a) an NPN tracking transistor having the same characteristics as said input transistors;
   (b) circuit means acting on both said tracking and input transistors so as to cause the same amount of current to flow in the collector of each of said transistors regardless of fluctuation in said common mode input voltages, whereby to limit the tracking transistor to the same amount of base current as the bias current at the base of each of said input transistors; and
   (c) circuit means including a multi-collector lateral PNP transistor connected in a feedback loop with said tracking transistor and including identical first, second and third collectors, said first collector being connected to the base of said tracking transistor whereby the current flowing out of each of said first, second and third collectors is limited to the base current of said tracking transistor and is therefore equal to the bias current at the base of each of said input transistors, said second and third collectors being respectfully connected to the bases of said input transistors, whereby the current flowing out of each of said second and third collectors cancels out the bias current at the base of each of said input transistors, only said collectors of said circuit means including said PNP transistor being connected to the bases of said tracking and input transistors.

14. An arrangement according to claim 13 wherein said first circuit means includes means for causing the tracking transistor to saturate so as to cause the tracking transistor to rapidly discharge any capacitance present at its base during slewing in the negative direction of the overall integrated circuit, whereby to allow slewing in the negative direction to take place rapidly.

15. An arrangement according to claim 13 including third circuit means for causing the base to collector voltages of said input and tracking transistors to be within a fixed voltage range of 100 mv to 200 mv, said third circuit means including means for causing the base to collector voltage of said tracking transistor to always equal and track over temperature the base to collector voltage of each of said input transistors within said voltage range.

16. An arrangement according to claim 13 wherein said first circuit means including means for adjusting slightly the amount of current which flows in the collector of said tracking transistor as compared to the current flowing in the collector of each of said input transistors while keeping the amounts substantially equal, said adjusting means including a network of resistors and a network of zener diodes which can be selectively shorted out to provide said adjustment.

17. In an integrated circuit such as an operational amplifier, a comparator, or the like having a common mode input voltage, an arrangement for cancelling the input bias current at the base of each of two identical input NPN transistors forming part of the integrated circuit, said arrangement comprising:
  (a) an NPN tracking transistor having the same characteristics as said input transistors;
  (b) circuit means acting on both said tracking and input transistors so as to cause currents to flow in the collectors of said transistors in a given, fixed proportion to one another regardless of fluctuations in said common mode input voltages, whereby to limit the tracking transistor to a base current in the same given proportion to the bias current at the base of each of said input transistors; and
  (c) circuit means including a multi-collector lateral PNP transistor connected in a feedback loop with said tracking transistor and including identical first, second and third collectors, said first collector being connected to the base of said tracking transistor such that the current flowing out of each of said first, second and third collectors is limited to the base current of said tracking transistor, said second and third collectors including means acting on their respective currents to provide altered currents which along with the current flowing out of said first collector are in said given proportion with one another and which are therefore equal to the bias currents at the base of each of said input transistors, said second and third collectors being respectfully connected with the bases of said input transistors so as to apply said altered currents to the bases of said input transistors, whereby the altered currents cancel out the bias currents at the bases of said input transistors, only said collectors of said circuit means including said PNP a transistor being connected to the bases of said tracking and input transistors.

18. In an integrated circuit such as an operational amplifier, a comparator, or the like with input bias currents at picoampere levels, an arrangement for cancelling the picoampere level input bias current at the base of each of first and second identical input transistors forming part of the integrated circuit, said arrangement comprising:
  (a) a tracking transistor having the same characteristics as said input transistors;
  (b) first circuit means acting on both said tracking and input transistors so as to cause the same fixed amount of current to flow in the collector of each of said transistors, whereby to limit the tracking transistor to the same amount of base current as the bias current at the base of each of said input transistors and, at the same time, because the current flowing into the collector of said tracking transistor is fixed and the tracking transistor saturates during slewing in the negative direction, the tracking transistor is able to rapidly discharge any capacitance present at its base during negative slewing of the overall integrated circuit in order to allow slewing in the negative direction to take place rapidly;
  (c) second circuit means connected to the base of each of said tracking and input transistors for supplying the tracking transistor with its base current and, at the same time, applying second and third identical currents to the bases of said input transistors in order to cancel the bias current at the input transistors' bases; and
  (d) third circuit means for causing the base to collector voltages of said input and tracking transistors to be within a fixed voltage range of about 100 mv to 200 mv, said third circuit means including means for causing the base to collector voltage of said tracking transistor to always equal and track over temperature the base to collector voltage of each of said input transistors within said voltage range.

19. An arrangement according to claim 18 wherein said second circuit means is configured such that its second and third currents are equal to the base current of the tracking transistor independent of the presence or absence of leakage current in the integrated circuit.

20. An arrangement according to claim 19 wherein said first circuit means includes means for adjusting slightly the amount of current which flows in the collector of said tracking transistor as compared to the current flowing in the collectors of each of said input transistors while keeping the amount substantially equal, said adjusting means including a network of resistors and a network of zener diodes which can be selectively shorted out to change the resistance in said network and thereby provide said adjustment.

21. An arrangement according to claim 18 wherein said integrated circuit has a common mode input voltage and wherein the same amount of currents flow into the collectors of said input and tracking transistors regardless of fluctuations in said common mode input voltage.

22. In an integrated circuit such as an operational amplifier, a comparator, or the like having a common mode input voltage, an arrangement for cancelling the input bias current at the base of an input NPN transistor forming part of the integrated circuit, said arrangement comprising:
  (a) an NPN tracking transistor having the same characteristics as said input transistor;
  (b) circuit means acting on both said tracking and input transistors so as to cause currents to flow in the collectors of said transistors in a given, fixed proportion to one another regardless of fluctuations in said common mode input voltage, whereby to limit the base current of said tracking transistor and the bias current at the base of said input transistors to said given proportion; and
  (c) circuit means including PNP transistor means connected in a feedback loop with said tracking transistor and including first and second collector means respectively connected to the bases of said tracking and input transistors for supplying the tracking transistors with its base current and, at the same time, providing along with said last-mentioned base current a second current in said given proportion and applying said second proportionate current to the base of said input transistor in order to cancel the bias current at the input transistor's base, only said collectors of said circuit means including said PNP a transistor being connected to the bases of said tracking and input transistors.

23. An arrangement according to claim 22 wherein said given proportion is such that currents flowing into the collectors of said tracking and input transistors are equal and wherein said PNP transistor means is a multi-collector lateral PNP transistor having first and second collectors serving as said first and second collector means, respectively.

* * * * *